United States Patent [19]

Esaki et al.

[11] 4,143,388

[45] Mar. 6, 1979

[54] MOS TYPE SEMICONDUCTOR DEVICE

[75] Inventors: Hideya Esaki; Takashi Hirao; Hakuhei Kawakami, all of Neyagawa, Japan

[73] Assignee: Matsushita Electric Industrial Co., Ltd., Kadoma, Japan

[21] Appl. No.: 797,835

[22] Filed: May 17, 1977

[30] Foreign Application Priority Data

May 18, 1976 [JP] Japan .................................. 51-57399

[51] Int. Cl.² .............................................. H01L 29/78
[52] U.S. Cl. ............................................ 357/23; 357/41; 357/42; 357/59; 357/91
[58] Field of Search .................... 357/91, 23, 41, 42, 357/59

[56] References Cited

U.S. PATENT DOCUMENTS

| 3,860,454 | 1/1975 | Witt et al. ................................ 357/91 |
| 3,897,274 | 7/1975 | Stehlin et al. ........................... 357/91 |
| 4,029,522 | 6/1977 | De La Moneda ....................... 357/91 |

Primary Examiner—Edward J. Wojciechowicz
Attorney, Agent, or Firm—Cushman, Darby & Cushman

[57] ABSTRACT

A MOS type semiconductor device, wherein at least one oblique face is provided on at least a part of a gate electrode which is provided on a principal face of said substrate with a gate insulation film inbetween, and at a specific depth from the oblique face, that is, in parallel with this oblique face, an ion-implanted layer is provided in a manner to obliquely cross the surface of said substrate. In this MOS type semiconductor device the channel is made immediately underneath the surface of the substrate and in the ion-implanted layer, and therefore the channel length is determined by the thickness of the ion-implanted layer. By controlling the thickness of the ion-implanted layer, a short channel length, which is required for improving the operating speed and/or the handling current capability of MOS type semiconductor devices, is obtainable.

20 Claims, 8 Drawing Figures

MOS TYPE SEMICONDUCTOR DEVICE

BACKGROUND OF THE INVENTION

1. Field of the Invention

This invention relates to semiconductor devices, and more particularly to MOS type semiconductor devices such as MOS FETs or MOS logic devices.

2. Description of the Prior Art

The MOS type transistor heretofore has been said to have shortcomings of slow operating speed and small output current handling capabilities. Hence, the MOS transistors is disfavored as compared to the bipolar transistor in the fields where the high speed or the large current handling capability is required. For improving these characteristics in the MOS transistor, making the channel length between source and drain short is the most effective means, and various attempts for shortening the channel length have been tried. Where a fabrication method utilizing photolithography is used, for attempting to shorten the gate length, about 1 to 2 $\mu$m is a shortest limitation practically attainable due to inherent nature of light diffractions. Also, since the spreading in resulted gate length directly causes the spreading in the mutual conductance gm, a very high precision is required in the photolithography. Although even those patterns with sizes under 1 $\mu$m can be processed with the electron-beam lithography or the X-ray lithography, it will take still a long time that those processes are put to practical uses like as the conventional photolithographic process is now widely used in practice.

A method not depending on photolithography, has been developed in which two different kinds of impurities of mutually opposite conductivity types are diffused through a single diffusion mask and the channel length is defined with the difference in their diffusion depths. However, since the threshold value of the MOS type transistors varies with the impurity concentration, a precise control of the impurity distribution was required. Particularly, if a shallow diffusion is performed for obtaining the short channel length, the impurity distribution becomes very steep and hence the threshold value changes greatly with a slight variation in the distrubution of two different kinds of impurities. Thus, there exists a difficulty in controlling the threshold value. This is due to its defining procedure of the gate length wherein two different kinds of impurities must be controlled at the same time.

OBJECT OF THE INVENTION

The object of this invention is to provide a novel MOS type semiconductor device in which, breaking the technical limitation existing in the conventional photolithographic process, a very short channel length of a MOS type semiconductor device is obtainable.

In this invention, the making of a short channel is attained by defining the channel length with an ion-implantation.

This invention purports to make the channel length short by defining the channel length with an ion-implantation. That is, the above purpose is attained in a semiconductor device characterized by having at least one oblique face which is oblique with respect to the principal surface of a substrate on at least a part of a side face of a patterned layer deposited on the semiconductor substrate, and having an ion-implanted layer which obliquely crosses the principal surface of the substrate by being disposed at a specified depth determined by a projected range of the ion beam from the oblique face.

Other and further objects, features and advantages of the invention will appear more fully from the following description.

DETAILED DESCRIPTION OF PREFERRED EMBODIMENTS

When an impurity is implanted into a semiconductor substrate by means of the ion-implantation process, an ion-implanted impurity layer is formed. The impurity distribution of this layer is such that its peak comes at a depth Rp, called project range, from the surface and its distribution is Gaussian with a full width, i.e., thickness 2 $\Delta$Rp, where $\Delta$Rp is called the projected standard deviation of the ion-implantation and is a constant determined by a substrate material, an impurity species used and an accelerating voltage of the implantation ion beam. For the purpose of obtaining a short channel length, the ion-implanted layer should be formed in a manner to obliquely cross the interface (hereinafter simply called a substrate interface) between the semiconductor substrate and the gate insulation film. For this ion-implanted layer, the impurity concentration is taken to be high enough to form an enhancement channel at the substrate interface. In this invention, in order to form the ion-implanted layer so as to obliquely cross the substrate interface, for example, a gate electrode having an oblique face is utilized as shown in FIG. 1.

Figure 1:
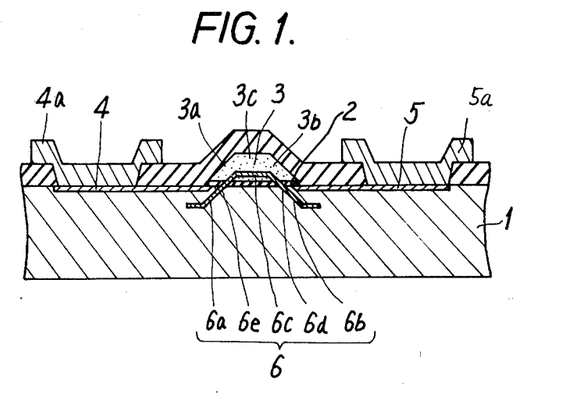
FIG. 1 is a sectional view illustrating a construction of a MOS type field-effect transistor of an embodiment example in accordance with the present invention.

In FIG. 1 showing a MOS FET, a gate insulation film 2 is formed on a semiconductor substrate 1, then a gate electrode 3 is further overlaid on this gate insulation film 2. On either side of the gate electrode 3, source and drain diffusion layers 4 and 5 and their corresponding electrodes 4a and 5a are formed. The gate electrode 3 is, for example, made of a low-resistance polycrystalline silicon and has oblique faces 3a and 3b which decrease their heights in the direction to the source layer 4 and to the drain layer 5.

Then, an ion-implanted layer 6 is formed by implanting an impurity of the same conductivity type as that of the substrate 1 with using the gate electrode 3 as a mask. The ion-implanted layer 6 comprises a horizontal part 6c which is about in parallel with a horizontal part 3c of the gate electrode 3 and oblique parts 6a and 6b which are about in parallel with oblique faces 3a and 3b of the gate electrode 3, respectively. The accelerating voltage of the ion-implantation is selected so that the ion-implanted layer 6 crosses the substrate interface at its oblique parts 6a and 6b. Hereupon, an amount of implanted impurity is taken to be high enough so that crossing parts 6e and 6d, which are the parts at which the oblique parts cross the substrate interface, become enhancement channels. Whilst, for the substrate 1, a low concentration substrate is selected beforehand so that the remainder of the substrate interface (other than 6e and 6d) become depletion channels. It is also possible to form depletion channels by introducing an impurity of opposite conductivity type to that of the substrate 1 beforehand. Diffused extentions in the horizontal direction of the source and drain diffusion layers 4 and 5 should be such that the end fronts of them touch both boundary faces of the ion-implanted layers at their crossing part 6e and 6d, or less than that. If the diffusion layers 4 and 5 spread into the crossing parts 6e and 6d, the channel length is influenced thereby, and hence it becomes impractical.

Figure 2:
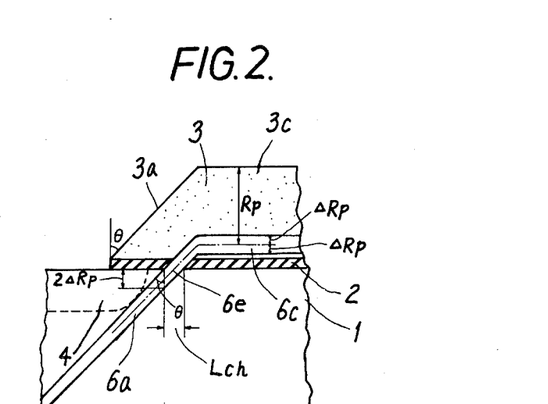
FIG. 2 is an enlarged sectional view of the transistor of FIG. 1 in the neighborhood of a gate electrode having an oblique face, FIGS. 3 (A) to (F) are drawings illustrating various steps of the making process of an E/D (enhancement and depletion modes) MOS type inverter device of other embodiment example.

For explaining the relation between the channel length and the oblique face 3a of the gate electrode, the configuration of the neighborhood of the oblique face is shown in an enlarged sectional view of FIG. 2. For simplicity of the explanation, the oblique face is assumed to be a flat plane, not being a curved face. The oblique angle $\theta$ is an angle between the normal of the substrate 1 and the oblique face 3a of the gate electrode. The ion-implanted layer has a distribution which can be approximated by the Gaussian distribution with its center at a depth Rp (projected range) from the oblique face 3a and the flat plane 3c of the gate electrode and with its spreading width, i.e., half thickness of the layer $\Delta Rp$, i.e., the projected standard deviation. Therefore, the thickness of the ion-implanted layer 6a and 6c is taken to be 2 $\Delta Rp$. In the case of the p-type ion-implanted layer, for example, a thickness Lch of said layer measured in a direction of source to drain at its part 6e, at which the oblique part 6a of said layer crosses an inversion layer (n-type) or a part doped to n-type which is lying underneath the interface between the p-type substrate 1 and the gate insulation film 2, becomes a length of the crossing part 6e or 6d. Hereupon it is easily understood that there exists the following relation between Lch and $\Delta Rp$:

$$Lch = 2 \Delta Rp \cdot \tan \theta,$$

where, if
$\theta = 45°$, $$Lch = 2 \Delta Rp,$$

and if
$\theta = 30°$, $$Lch = 2 \Delta Rp/\sqrt{3}.$$

The spreading, i.e., half, thickness of the ion-implanted layer, $\Delta Rp$, can be regarded as a material constant and hence it is not a factor causing the variation in characteristics of the device. Therefore, for determining the channel length Lch with a good accuracy, it is enough to control only a single factor of the oblique angle $\theta$ of the gate electrode 3.

Speaking more strictly, the thickness Lch defined before does not necessarily coincide with the effective channel length which corresponds to the electrical characteristics of the MOS type transistor. Letting Leff be the effective channel length, the following relation between Leff and Lch can be derived from the known relation (which may be found in articles, for example, P. P. Wang and O. S. Spencer, IBM Jour. Res. Develop. p. 530, Nov., 1975):

$$Leff = Lch \times \sqrt{2 \ln (Np/Nd)},$$

where Np is the peak concentration of the ion-implanted layer, and Nd is the impurity concentration corresponding to zero volt of the threshold value of the MOS transistor, or is the impurity concentration of opposite conductivity type to that of the substrate 1 introduced beforehand into the substrate interface. When the ratio Np/Nd varies as much as 50% from 4 to 6, the factor $\sqrt{2 \ln (Np/Nd)}$ varies only 14% from 1.665 to 1.893. Therefore, Leff can also be regarded to be dependent practically only upon a single factor of $\theta$.

Figure 3:
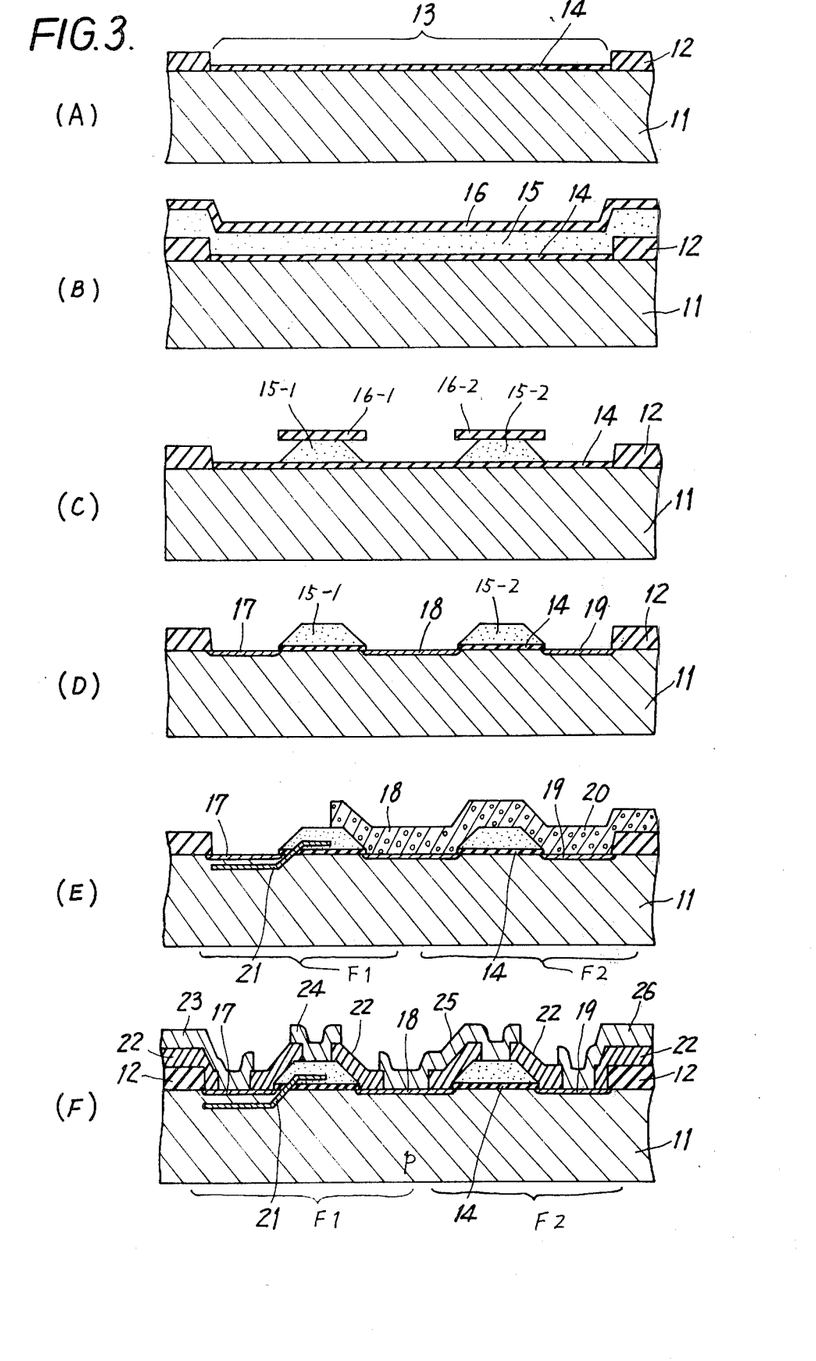

In FIG. 3, a making process of an E/D MOS type device (wherein a case of an inverter is shown as an example) using the MOS type transistor in accordance with the present invention is illustrated. Hereupon, a high resistivity p-type substrate 11 is supposed to be used, as an example. The substrate 11 is, for instance, a silicon single crystal of a specific resistance of 40 to 60 $\Omega$cm and whose principal face is the (111) orientation surface. For this substrate, with the usual making method of the gate oxide film, an n-type inversion layer is formed on the substrate interface. In FIG. 3 (A), precedently, a channel stopper (not shown) is formed, on the surrounding part of the FET, the part later having a field oxide on the principal face, by diffusing boron (B), for example, with a low concentration value. Then, on the principal face of the substrate 11, an oxide film 12 of 1 $\mu$m thick is deposited and then a window 13 is opened by the photolithography. This oxide film 12 functions to isolate individual elements as a so-called field oxide. By the action of the aforementioned channel stopper formed by the diffusion of boron, in those parts underneath the oxide film 12, no n-type inversion layer is formed.

In the step shown in FIG. 3 (A), a gate oxide film 14 is grown on the part of the window of the substrate 11. For this process, by exposing the substrate in the dried oxygen atmosphere for 50 minutes at 1100° C., an oxide film of about 1100Å thick is grown.

Since a high resistivity substrate is used as the substrate 11, an n-type inversion layer becoming a depletion channel is formed at an interface between the gate oxide film and the substrate 11. When, however, a p-type low resistivity substrate in which the inversion layer is not formed is used, an n-type low concentration layer is formed by ion-implanting phosphor (P) so that an n-type inversion layer is formed.

Next, as shown in FIG. 3 (B), a polycrystalline silicon 15 which is to become a gate electrode is formed, and then thereon an oxide film 16 which is to become an etching mask is deposited by chemical vapor deposition. Then, by known photolithography, etching masks 16-1 and 16-2 for use in etching the polycrystalline silicon is formed. Inserting the substrate into a plasma-etching apparatus, the polycrystalline silicon 15 is etched so that the gate electrodes 15-1 and 15-2 of FIG. 3 (C) are formed. Since in the plasma-etching the etching speed for the oxide film is slow, the gate oxide film 14 is left with being little etched. By adjusting the plasma-etching condition (gas pressure, discharging power, or etching time, in $CF_4$ gas of 0.4 mm Hg pressure with 20 watt radio frequency power), an oblique angle as shown in FIG. 3 (C) is given to the gate electrodes 15-1 and 15-2. Thus this angle can be controlled. This angle becomes steep when the etching time is longer than a certain specified time. It is also possible to control the above angle by the sputter-etching instead of the plasma-etching or by the selective oxidation or diffusion of the polycrystalline silicon.

Next, as shown in FIG. 3 (D), after removing the oxide films 14 and 16 by a solution containing fluoric acid, using the gate electrodes 15-1 and 15-2 as the mask, $n^+$-diffusion layers 17, 18, and 19 are formed with a shallow depth by depositing an impurity with evaporation on the substrate and then performing the thermal treatment on it (FIG. 3 (D)). It is suitable to use arsenic as the impurity because of its low diffusion coefficient. In this process, since the arsenic is diffused also into the gate electrodes 15-1 and 15-2, resistance of these gate electrodes decreases. It is also possible to add the impurity beforehand at the chance of deposition of the polycrystalline silicon.

Next, after covering a region including all area of the gate electrode 15-2 and a part of area of the gate electrode 15-1 with a photo-resist film 20, an impurity of same conductivity type as that of the substrate 11, in this example boron with which a p-type is resulted, is ion-implanted. Then an ion-implanted layer 21 is formed at a certain depth from the surfaces of the substrate 11 and of the gate electrode 15-1, the depth being determined by the projected range Rp with a spreading width 2 ΔRp as shown in FIG. 3 (E). Hereupon, by making the photo-resist film 20 not to cover any part of the gate electrode 15-1 (this is done at will by the design of the mask pattern), the ion-implanted layer 21 can be made in a manner to obliquely cross the interface between the gate electrode and the substrate near both ends of the gate electrode as shown in FIG. 1. On the other hand, as shown in FIG. 3 (E), since the gate electrode 15-2 is covered completely with the photo-resist film 20, the ion-implanted layer is not formed in this region. The impurity concentration of the ion-implanted layer 21 (or 6 of FIG. 1) should be predetermined so as to form an enhancement channel at its crossing point with the substrate interface. Since, as the substrate 11, a high resistivity substrate is selected in advance so as to form an n-type inversion layer at the substrate interface, a half part F2 of the device including the gate electrode 15-2 which has no ion-implanted layer 21 becomes to be a depletion type.

Then, after removing the photo-resist film 20, an oxide film 22 is deposited by the chemical vapor deposition, and then after opening a contact window by photolithography, metal electrodes 23 to 26 are formed therein (FIG. 3 (F)). The electrode 23 is an electrode for contacting the source 17 and also the Vss wiring (low voltage source terminal), the electrode 24 is an input terminal to which the gate electrode 15-1 is connected, the electrode 25 is an output terminal for contacting the diffusion layer 18 and the gate electrode 15-2 which is to be connected to a wiring to a next stage outside the drawing, and the electrode 26 is an electrode for contacting the drain region 19 and also the $V_{DD}$ wiring (high voltage side source terminal).

The structure shown in FIG. 3 (F) is, as is clear from the above explanation, an E/D MOS inverter device in which the half part of it, F2, forming a depletion transistor, acts as a load, and other half part of it, F1, forming an enhancement transistor, act as a driving element. Therefore, by using this as a basic element, it is easy to realize a NOR gate or a NAND gate.

Hereupon, since the value of the impurity concentration of the ion-implanted layer (6 of FIG. 1, 21 of FIG. 3) is about $10^{16}$ to $10^{17}$ atoms/cm$^{-3}$, while the impurity concentration in the polycrystalline silicone (3 of FIG. 1, 15-1 and 15-2 of FIG. 3) is very high of about $10^{19}$ to $10^{21}$ atoms/cm$^{-3}$, the ion-implanted layer formed inside the polycrystalline silicon does not give any influence to the electrical characteristics.

As described above, only by changing the pattern of the photo-resist film 20, any one of the following three different types of transistors is made: (1) a symmetric type transistor having enhancement channels near both ends of the gate electrode (FIG. 1), (2) an asymmetric type transistor having an enhancement channel near only either side of the gate electrode (F1 of FIG. 3 (E), wherein 15-1, 17, and 18 of act as gate, source, and drain, respectively), and (3) a depletion transistor having no enhancement channel (F2 of FIG. 3 (E), wherein 15-2, 18, 19 of act as gate, source, and drain, respectively).

Although, in this embodiment example, the case of using polycrystalline silicon as the gate electrode has been described, some other material having a good controllability for adjusting the angle of the oblique face, for example such as aluminum or molybdenum, can be used equally for the gate electrode.

In FIG. 3 (F), the metal electrodes 23 to 26 are formed directly on the diffusion layers 17, 18, and 19. However, since these diffusion layers are thin, by an eventual reaction of them with electrode metal such as aluminum, there exists the risk of happening of short-circuiting between the metal electrodes and the substrate. For avoiding this risk, by providing polycrystalline silicon layers containing an impurity for forming the same conductivity type as that of the diffusion layers between the diffusion layers 17, 18, 19 and the the metal electrodes 23, 25, 26, the undesirable reaction between thin diffusion layers 17, 18, 19 and the metal electrodes 23, 25, 26 can be eliminated.

As a practical example for FIG. 3, the following parameter values can be cited;
  the substrate 11 — p-type, (100) orientation, 50 Ωcm,
  the gate oxide film 14 — 1100Å,
  the gate electrode 15 — polycrystalline silicon of 6500Å thick,
  the oblique angle θ of the gate electrode — 35° ± 5°,
  the projected range Rp of the ion-implanted layer 21 — 4600Å (boron-implanted),
  the spreading width ΔRp of the layer 21 — 1000Å,
  the accelerating voltage of the implantation ion beam — 120 KV,
  the depth of the source and drain diffusion layers — 0.2 μm,
  the enhancement channel length Lch — 0.14 μm,
  ratio ± ΔLch/Lch — ±20%, (± ΔLch is the deviation of Lch for ±5° deviation from 30° of the angle θ),
  the effective channel length Leff for the ration of Np/Nb = 4 — 0.23 μm.

Figure 4:
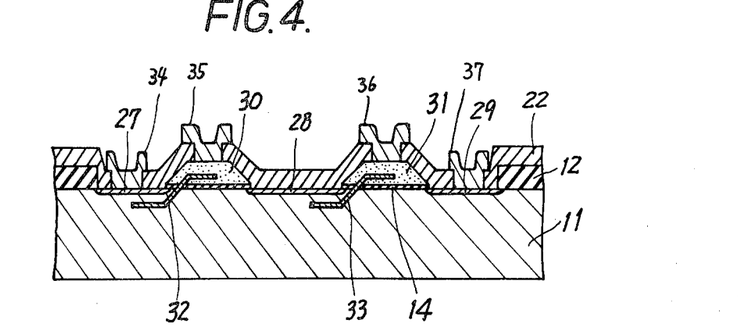
FIG. 4 is a sectional view illustrating a construction of a dual-gate MOS transistor of still another embodiment example.

Another embodiment example in accordance with the present invention is shown in FIG. 4. The corresponding parts to those of FIG. 3 are numbered by the same numerals with those of FIG. 1. The device of FIG. 4 is a dual gate MOS (or tetrode MOS) transistor having two gate electrodes 30 and 31 between a source 27 and a drain 29. A diffusion layer 28 existing between those two gates is inserted for reducing the series resistance of the transistor. The gate electrodes 30 and 31 have ion-implanted layers 32 and 33, respectively, which form enhancement channels at the substrate interface. Numeral 34, 35, 36, and 37 designate metal electrodes. This dual gate MOS is mainly used in tuner circuits of such as television sets or FM radios in a manner that the input signal is applied to 30 as the first gate and the control signal is applied to 31 as the second gate. The MOS transistor in accordance with the present invention is suitable for those purposes mentioned above because of its high mutual conductance value and its high speed by the reason described later.

Figure 5:
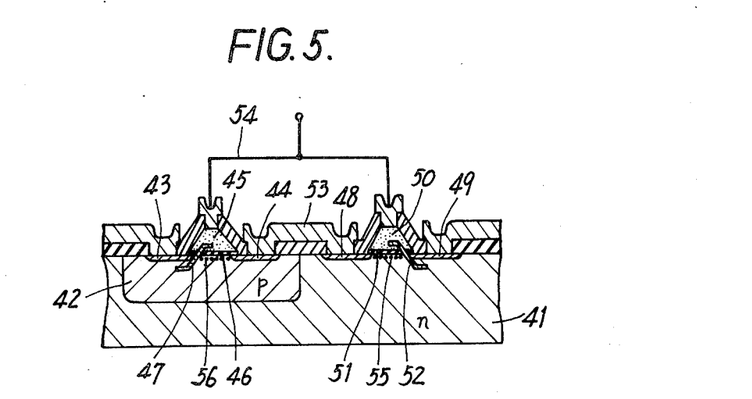
FIG. 5 is a sectional view illustrating a construction of a pn complementary MOS type inverter device of still another embodiment example.

In FIG. 5, still another embodiment example in accordance with the present invention which is applied to the pn complementary type MOS inverter device is shown. A p-type well 42 is diffused inside an n-type substrate 41, and therein a source 43, a drain 44 are formed. A gate electrode 45 of an n-channel transistor are provided on the surface of the p-type well with a gate oxide film 46 inbetween. A p-type ion-implanted layer 47 which obliquely crosses the interface between the p-type well 42 and the gate oxide film 46 is provided only on the side near the source 43 of the gate electrode 45. Meanwhile, a source 49 and a drain 48 of a p-channel transistor is formed in the n-type substrate 41, and a gate electrode 50 is provided on the surface of the n-type substrate 41 with a gate oxide film 51 inbetween. An n-type ion-implanted layer 52 which crosses the interface between the n-type substrate 41 and the gate oxide film 51 is provided only on the side near the source 49 side of the gate electrode 50. The drains 48 and 44 respectively of the p- and n-channel transistors are connected each other by a metal wiring 53, thereby forming an output terminal, and also the respective gate electrodes 50 and 45 are connected each other by a metal wiring 54, thereby forming an input terminal. In the remaining parts of the substrate interfaces other than the part crossed by the ion-implanted layers 52 and 47, a p-type thin layer of low impurity concentration 55 and an n-type thin layer of low impurity concentration 56 are provided by ion-implantation, respectively, so as to make the remaining parts depletion type. The above explanation is given to the case of the inverter, for example, but based on this, the construction of NOR gates or NAND gates and other pn complementary circuits are easy. Such pn complementary device has a high speed characteristic owing to the short channel length which is a feature of the present invention, in addition to the characteristic of low power consumption which is a general feature of the complementary types.

In this invention, the impurity concentration of the ion-implanted layer is higher than that of its neighboring outside parts, and hence when a voltage is impressed between the source and the drain the depletion regions spread more in the neighboring outside parts than in the ion-implanted layer. Accordingly the spreading of the depletion region inward the ion-implanted layer is limited. Thus, the punch-through between source and drain is well prevented, and therefore inspite of the short channel length, the lowering of the drain breakdown voltage due to the short channel effect, which has been the case when the short channel length was adopted, is very little.

However, in the structures shown in FIGS. 1 to 5, there exists the upper limit for the diffusion depth of the source and drain diffusion layers, then the radius of curvature of the diffusion fronts at the edges of the diffusion layers becomes small. Hence the electric field concentres to these parts, and consequently much improvement in the breakdown voltage cannot be obtained. This is caused by that the gate electrode having the oblique face is used as a mask two times both for the formations of the ion-implanted layer crossing obliquely with the substrate interface and of the formation of the source and drain diffusion layers.

Figure 6:
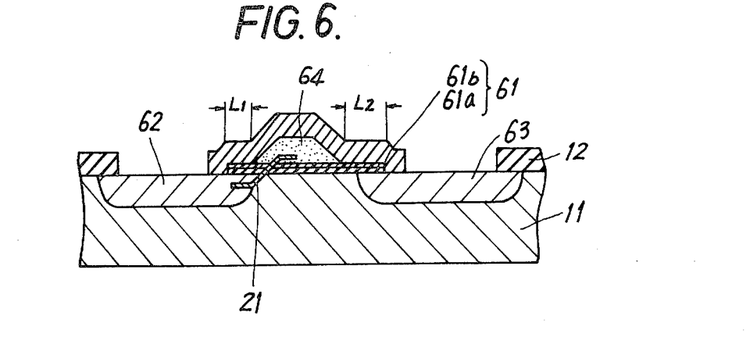
FIG. 6 is a sectional view illustrating a construction of a MOS type transistor attempting the high voltage use of still another embodiment example.

Therefore, another embodiment example of FIG. 6 is purposed to obtain the high breakdown voltage by preparing a mask separately for the source and drain formation from that for the ion-implantation layer formation. The gate insulation film 61 comprises two layers of an oxide film 61a and a nitride film 61b. The source and drain diffusion regions 62 and 63 are formed with using the nitride film 61b as a mask. The gate electrode 64 is formed so as to have width smaller than that of the nitride film 61b and its edge parts becomes to be oblique faces. That is, the width of the gate electrode 64 is selected that its edge on the source side comes inside as much as $L_1$ and its other edge on the drain side comes inside as much as $L_2$ respectively from its corresponding edge of the nitride film 61b. The diffusion depth of the source and drain regions 62 and 63 should be within the length $L_1$. Hereupon, although $L_1 = L_2$ is of course allowable, for obtaining a still higher breakdown voltage for the drain, in the example of FIG. 6, the case of taking $L_2 > L_1$ is shown. If the source and the drain are diffused separately, it is also possible to make the drain diffusion layer deeper than the source diffusion layer. Since $L_1$ and $L_2$ are the length which can be designed at will according to the requirement, the diffusion depth of the source and drain diffusion layers can also be designed according to the requirement. In this structure, since the diffusion depth can be taken large, the concentration of the electric field near the edges of the diffusion layers does not take place. As described above, this invention can also be applied to the structure with the high breakdown voltage.

Figure 7:
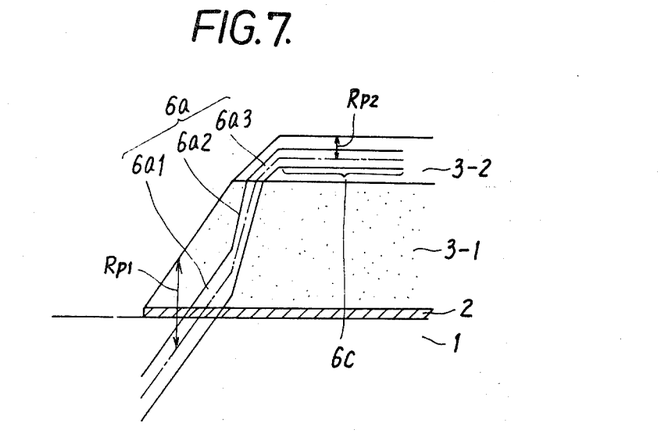
FIG. 7 is an enlarged sectional view in the neighborhood of the oblique face having a mask layer of still another embodiment example.

Furthermore, in FIG. 2, if the depth Rp from the surface of the ion-implanted layer is made shallow, the oblique part 6a comes close to the edge of the gate electrode 3, then a situation that the oblique part 6a overlaps with the diffusion layer 4 would happen. The diffusion layer 4 is not necessarily to be extending down to beneath the gate electrode 3, hence it is also permissible to form it under the part outside the gate electrode 3. However, since the diffusion layer 4 is for decreasing the resistance value of the path between the electrode 4a (FIG. 1) and the edge of the gate electrode, it is still desirable that the diffusion layer 4 is extending to the part beneath the gate electrode 3. Therefore, in such a case described above, the depth Rp of the ion-implanted layer cannot be made much shallow. In this case, if the thickness of the gate electrode 3 is thin, a part of the flat or horizontal part 6c of the ion-implanted layer is formed on the surface of a part of the substrate 1 beneath the gate insulation film 2. Then there is the risk that the length of the formed channel becomes very long. On the other hand, since it becomes often necessary in the circuit construction of the IC or LSI to crossover the metal wiring over the gate electrode 3 by overlaying an insulation film inbetween, it is desirable to make the gate electrode as thin as possible in order to make the metal wiring on a flat face for reliable connection. In the following, an improved embodiment example, wherein, even though the gate electrode 3 is made thin as required above, the flat horizontal part 6c does not enters into the substrate, is explained with referring to FIG. 7. This drawing is depicted with keeping the correspondence with FIG. 2, and the corresponding parts to those of FIG. 2 are numbered by the same numerals as those of FIG. 2. The main difference of FIG. 7 from FIG. 2 is that, in contrast with the single material of the gate electrode 3 of FIG. 2, in FIG. 7 a gate electrode 3-1 and thereon a mask layer 3-2 for making the ion-implanted depth into the gate electrode 3-1 to be shallow are overlaid successively, so that they form a two-fold laminated layer. Since the mask layer 3-2 is provided for forming the flat horizontal part 6c of the ion-implanted layer at a depth as shallow as possible from the surface, it is needless to mention that the projected range Rp2 in the mask layer 3-2 is desirable to be smaller than that of the gate electrode, Rp1. As the material fulfilling the above requirement, for the case that the polycrystalline silicon is used as the gate electrode 3-1, either one of a silicon nitride ($Si_3N_4$) film, a photo-resist film, or a metal film of one of gold, platinum, molybdenum (Mo) and tungsten (W) can be used. In the example shown in FIG. 7, a ratio between each projected range of the gate electrode Rp1 and of the mask layer Rp2 is taken to be $R_{p1}/R_{p2} = 4$, wherein the oblique part of the ion-implanted layer, 6a, comprises a part 6a1 whose shape is mainly determined by the gate electrode 3-1, a part 6a3 whose shape is mainly determined by the mask layer 3-2, and a transition part 6a2 whose shape is determined by both of the mask layer 3-2 and the gate electrode 3-1. This transition part 6a2 which is the part to connect the part 6a1 and 6a3 becomes very steeply inclined because of the difference between those two projected ranges of the layer 3-2 and of the layer 3-2. That is, in the structure of FIG. 7, it was prevented that the flat horizontal part 6c of the ion-implanted layer enters into the substrate 1 and resultantly the channel length becomes inadequately long.

Figure 8:
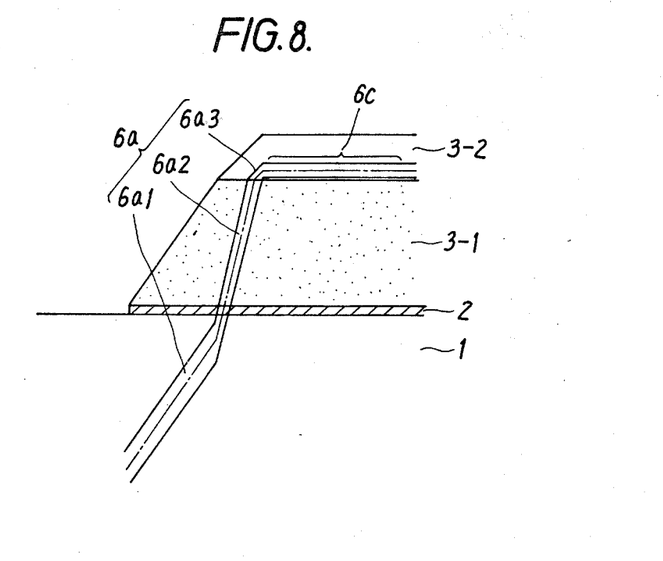
FIG. 8 is an enlarged sectional view in the neighborhood of the oblique face in the case with higher implantation energy of the ion beam than that of FIG. 7.

FIG. 8 shows another embodiment example in which the ion accelerating voltage in the ion-implantation is raised so as to make the steeply inclined transition part 6a2 of the ion-implanted layer cross the interface between the substrate 1 and the gate insulation film. Each numeral corresponds to that of FIG. 7. Since the transition part 6a2 is steeper than the part 6a1, the channel length becomes shorter in FIG. 8 than in FIG. 7. In FIG. 8, if a non-metal material is used as the mask layer 3-2, it is usually removed after the ion-implantation. In the case that the layer 3-2 is metal, it can be left to be used as a part of the gate electrode, and furthermore, this choice of material is suitable for the application of it to high-frequency devices because the metal film contributes to reduce the resistance in the gate wiring. Hereupon, if a metal which is resistive to the high temperature treatment, such as molybdenum or tungsten, is used as this metal material, even after providing the mask layer 3-2, processes such as diffusion or temperature treatment can be performed. Therefore, those processes used in the prior art can conveniently be used without much alteration.

Moreover, in the explanations for the abovementioned embodiment examples, the impurity concentration of the ion-implanted layer was taken to be high enough to form an enhancement channel. However, since generally no particular technique is required for controlling the concentration of the ion-implanted layer as desired, the case of lowering the concentration so as to form a depletion channel is also included in the scope of the present invention. That is, in the present invention, by the various characteristics of the part where the ion-implanted layer crosses the interface between the substrate and the gate insulation film, the characteristics of the MOS transistor, particularly, the threshold value or the effective channel length is substantially determined.

The MOS type semiconductor devices explained above have the following features.

(1) Regardless of the finest limit of attainable pattern by the photolithography due to the inherent optical resolution limit, MOS type transistors having very short channel lengths can be realized.

(2) Furthermore, main factor which should be taken into account is practically only the angle of the oblique face of the gate electrode. That is, any delicate control of plural number of factors is not necessary, and therefore the making of it is easy.

(3) This invention can be employed relatively easily by only a little alteration on the process for making the polycrystalline silicon gate. Therefore, this invention is easily adopted and developed to the LSI's.

(4) Since the channel length is basically determined by the distribution of impurity of the ion-implanted layer, a very short channel of about 0.1 to 0.2 $\mu$m can be realized, thereby a large mutual conductance can be obtained. Therefore, an FET having a large drain current and a short charge-discharge time of the load capacitance can be realized.

(5) Since amplifiers employing the MOS type transistors of this invention has a large gain, they can be used not only in digital circuits but also in analogue circuits.

(6) Since the impurity concentration is higher in the enhancement channel than in its neighboring or surrounding depletion channel, the depletion layer resulted by the impression of the drain-source voltage does not enter so much into the enhancement channel region. Accordingly, so-called short-channel effect that the threshold value decreases with the application of the drain-source voltage is little, and also the drain breakdown voltage is high.

(7) Three types, that is, 1) the symmetric type having the enhancement channels near both ends of the gate electrode, 2) the asymmetric type having the enhancement channel near only source side, and 3) the depletion type having no enhancement channel, can be selected at will by the design of only one photomask. The symmetric type is suitable for a transmission gate, the asymmetric type is for a driver side of a NOR gate or a NAND gate, and the depletion type is for a load for them, respectively. This invention can be applied easily to the circuit containing arbitrarily those elementary circuits mentioned above.

(8) By forming the mask layer, in which the projected range of the ion-implantation is short, on the gate electrode, the object of the present invention is attained even for the thin gate electrode. Accordingly the crossover wiring in the IC/LSI's is easily accomplished.

(9) By overlaying the metal film as the mask layer on generally used polycrystalline silicon gate electrode, the wiring resistance of the gate electrode can be reduced remarkably. Accordingly the present invention is suitable also for the application in the high-frequency range.

(10) By forming the mask layer on the gate electrode, and by forming the ion-implanted layer in a manner to cross the substrate interface just at the position beneath the oblique face of the mask, the channel length can be made still shorter even without making the oblique angle of the gate electrode very steep.

As described above, the present invention has the superior features that, owing to its original construction, the shortening of the channel length is accomplished, then thereby those shortcomings of the conventional MOS type semiconductor devices such as their slow speed or low mutual conductance are improved very much, and as the result of this the application range of the MOS type semiconductor devices can be expanded to various fields such as of high-frequency regions, large current use, and moreover not only to the digital circuits but also to the analogue circuits.

What we claim is:

1. A MOS type semiconductor device comprising:
   a substrate of a monocrystalline semiconductor of a first conductivity type and a specified impurity concentration,
   a pair of spaced apart regions of a second conductivity type formed in said substrate,
   a region having a high impurity concentration and formed insulated on a face of said substrate, said region having at least at one end part thereof an oblique face which is oblique to the face of said substrate; and
   an ion-implanted layer which has said first conductivity type, higher impurity concentration than that of the substrate and a specified thickness and is disposed under said oblique face, the inclination angle of said ion-implanted layers being dependent on said oblique face, thereby obliquely crossing the face of the substrate at a position just beneath said oblique face.

2. A MOS type semiconductor device according to claim 1 wherein said region is a gate electrode of a MOS type transistor provided on said substrate having an overlaying gate insulation film inbetween, and the crossing part of said ion-implanted layer with respect to said substrate is an enhancement channel of said MOS type transistor.

3. A MOS type semiconductor device comprising:
   a first MOS type transistor having a substrate of a monocrystalline semiconductor of a first conductivity type and a specified impurity concentration, a pair of spaced apart regions of a second conductivity type formed in said substrate, a region having a high impurity concentration and formed insulated on a face of said substrate, said region having at least at one end part thereof an oblique face which is oblique to the face of said substrate, and an ion-implanted layer which has said first conductivity type, higher impurity concentration than that of the substrate and a specified thickness and is disposed under said oblique face, the inclination angle of said ion-implanted layers being dependent on said oblique face, thereby obliquely crossing the face of the substrate at the position just beneath said oblique face; and
   a second MOS type transistor constructed on said semiconductor substrate.

4. A MOS type semiconductor device according to claim 3 characterized in that said second MOS type transistor has the same ion-implanted layer as that of said first MOS type transistor, and said first and second MOS type transistors are connected in cascade to form a dual gate MOS structure having two gate electrodes.

5. A MOS type semiconductor device according to claim 3 characterized in that said second MOS type transistor is a depletion type, and said first MOS type transistor is a driver which is driven by the input, whereas said second MOS type transistor is connected to said first MOS type transistor as its load.

6. A MOS type semiconductor device according to claim 3 characterized in that said second MOS type transistor has said ion-implanted layer of an opposite conductivity type with respect to that of said first MOS type transistor, thereby making said first and second MOS type transistors of opposite conduction type to each other to constitute a complementary construction.

7. A MOS type semiconductor device according to claim 1 characterized in that said high impurity concentration region includes a gate electrode and a mask layer formed thereon, and said mask layer is made of a material in which the projected range of the ion-implantation is shorter than that in said gate electrode.

8. A MOS type semiconductor device according to claim 7 characterized in that said gate electrode is of polycrystalline semiconductor and said mask layer is of metal.

9. A MOS type semiconductor device according to claim 8 characterized in that said mask layer is a metal which is resistive to a high temperature treatment.

10. A MOS type semiconductor device according to claim 7 characterized in that said ion-implanted layer obliquely crosses the surface of said substrate at the position just beneath said oblique face of said mask layer.

11. A MOS type semiconductor device made in a semiconductor substrate of a first conductivity type, comprising:
    spaced apart source and drain regions of a second conductivity type formed in a surface region of said substrate,
    a gate electrode having a high impurity concentration region, an oblique face on each edge and formed on a gate insulation film on the surface of said substrate for controlling the channel current between said spaced regions; and
    an ion-implanted oblique layer of said first conductivity type obliquely crossing the surface of said substrate at positions between said spaced regions and just beneath an oblique face of said gate electrode, and oblique layer having an impurity concentration higher than that of said substrate.

12. The MOS type semiconductor device of claim 11 wherein said ion-implanted oblique layer is formed beneath only one of said oblique faces of said gate electrode near the source region.

13. The MOS type semiconductor device of claim 11 wherein said ion-implanted oblique layer is formed beneath each of said oblique faces on both edges of said gate electrode thereby forming the device symmetrically.

14. The MOS type semiconductor device of claim 11 wherein said gate insulation film comprises a silicon oxide and an overlying nitride film, said spaced regions of source and drain being formed in alignment with said gate insulation film.

15. The MOS type semiconductor device of claim 11 wherein said spaced regions of source and drain are formed in alignment with said gate electrode.

16. The MOS type semiconductor device of claim 11 further comprising a mask layer formed on said gate electrode, the projected range of the ion-implantation in said mask layer being smaller than that in said gate electrode.

17. The MOS type semiconductor device of claim 16 wherein said gate electrode is of polycrystalline semiconductor and said mask layer is of metal.

18. The MOS type semiconductor device of claim 16 wherein said mask layer has an oblique face on each edge beneath which, said ion-implanted oblique layer crosses the surface of said substrate.

19. The MOS type semiconductor device of claim 11 further comprising another gate electrode in cascade with said first gate electrode to form a dual gate MOS structure.

20. A MOS type semiconductor device comprising:

a substrate of monocrystalline semiconductor of a first conductivity type and a specified impurity concentration, source and drain regions of a second conductivity type formed spaced apart in said substrate, a gate structure formed insulated on the surface of said substrate between said source and drain regions, said gate structure having at least at one oblique end face disposed obliquely with respect to the face of said substrate; and an ion-implanted layer of said first conductivity type and having higher impurity concentration than that of the substrate and a specified thickness, said implanted layer being disposed under said gate structure oblique face, and being inclined with respect to said substrate surface at an angle in accordance with said gate structure oblique face and obliquely crossing the face of the substrate at a position just beneath said gate structure oblique end face to form thereat an enhancement channel.

* * * * *